US012417036B2

(12) United States Patent
Duan et al.

(10) Patent No.: US 12,417,036 B2
(45) Date of Patent: *Sep. 16, 2025

(54) SYSTEM AND METHOD OF PERFORMING A READ OPERATION

(71) Applicant: YANGTZE MEMORY TECHNOLOGIES CO., LTD., Wuhan (CN)

(72) Inventors: ZhuQin Duan, Wuhan (CN); ZhiChao Du, Wuhan (CN); Yu Wang, Wuhan (CN); Daesik Song, Wuhan (CN); Xiaojiang Guo, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/739,841

(22) Filed: Jun. 11, 2024

(65) Prior Publication Data

US 2024/0329858 A1  Oct. 3, 2024

Related U.S. Application Data

(63) Continuation of application No. 18/184,312, filed on Mar. 15, 2023, now Pat. No. 12,061,799, which is a
(Continued)

(51) Int. Cl.
*G06F 3/06* (2006.01)
*G11C 16/26* (2006.01)

(52) U.S. Cl.
CPC .......... *G06F 3/0619* (2013.01); *G06F 3/0653* (2013.01); *G06F 3/0659* (2013.01); *G06F 3/0679* (2013.01); *G11C 16/26* (2013.01)

(58) Field of Classification Search
None
See application file for complete search history.

(56) References Cited

U.S. PATENT DOCUMENTS 10,090,046 B2   10/2018  Park et al.
2017/0133087 A1   5/2017  Park
(Continued)

OTHER PUBLICATIONS

International Search Report directed to International Patent Application No. PCT/CN2023/075962, mailed Jul. 18, 2023, 3 pages.

*Primary Examiner* — Kaushikkumar M Patel
(74) *Attorney, Agent, or Firm* — BAYES PLLC

(57) ABSTRACT

A memory device includes a memory array having memory cells, a page buffer coupled to the memory array through bit lines and including a latch, and a control logic coupled to the page buffer. The control logic is configured to perform a first read operation on the memory cells, and perform a second read operation on the memory cells by dividing the memory cells into a plurality of groups of memory cells, and performing a second read operation on the plurality of groups of memory cells based on a first set of develop times. Each of the first set of develop times is different. The control logic is also configured to perform a third read operation on the memory cells by performing a third read operation on the plurality of groups of memory cells based on a second set of develop times. Each of the second set of develop times is different. The control logic is further configured to determine a read develop time based on the third read operation.

20 Claims, 10 Drawing Sheets

Related U.S. Application Data continuation of application No. PCT/CN2023/075962, filed on Feb. 14, 2023.

(56) References Cited

U.S. PATENT DOCUMENTS

| | | |
|---|---|---|
| 2019/0096479 A1 | 3/2019 | Yu |
| 2020/0051645 A1* | 2/2020 | Choo ................ G11C 16/28 |
| 2020/0286545 A1 | 9/2020 | Yoon |
| 2021/0005265 A1 | 1/2021 | Lee |
| 2021/0005268 A1* | 1/2021 | Kim ................ G11C 11/5671 |
| 2022/0057968 A1 | 2/2022 | Kim |
| 2022/0093184 A1 | 3/2022 | Kim et al. |
| 2023/0251781 A1 | 8/2023 | Son |
| 2024/0028218 A1 | 1/2024 | Jeong |
| 2024/0078038 A1* | 3/2024 | Li ..................... G06F 3/0679 |

\* cited by examiner

SYSTEM AND METHOD OF PERFORMING A READ OPERATION

CROSS-REFERENCE TO RELATED APPLICATIONS

This application is a continuation of U.S. application Ser. No. 18/184,312, filed on Mar. 15, 2023, which is a continuation of International Application No. PCT/CN2023/075962, filed on Feb. 14, 2023, both of which are incorporated herein by reference in their entireties.

TECHNICAL FIELD

This description generally relates to the field of semiconductor technology, and more particularly, to a system and method for performing a read operation in a NAND memory.

BACKGROUND

As memory devices are shrinking to smaller die size to reduce manufacturing cost and increase storage density, scaling of planar memory cells faces challenges due to process technology limitations and reliability issues. For example, a three-dimensional (3D) memory architecture can address the density and performance limitation in planar memory cells.

In a NAND flash memory, many layers of memory cells can be stacked vertically such that storage density per unit area can be greatly increased. The vertically stacked memory cells can form memory strings, where the channels of the memory cells are connected in each memory string. Each memory cell can be addressed through a word line and a bit line. Data (i.e., logic states) of the memory cells in an entire memory page sharing the same word line can be read or programmed simultaneously. However, due to aggressive scaling, reliability can be a concern for a NAND flash memory.

BRIEF DESCRIPTION OF THE DRAWINGS

The accompanying drawings, which are incorporated herein and form part of the specification, illustrate the present disclosure and, together with the description, further serve to explain the principles of the disclosure and enable a person of skill in the relevant art(s) to make and use the disclosure.

Figure 1:
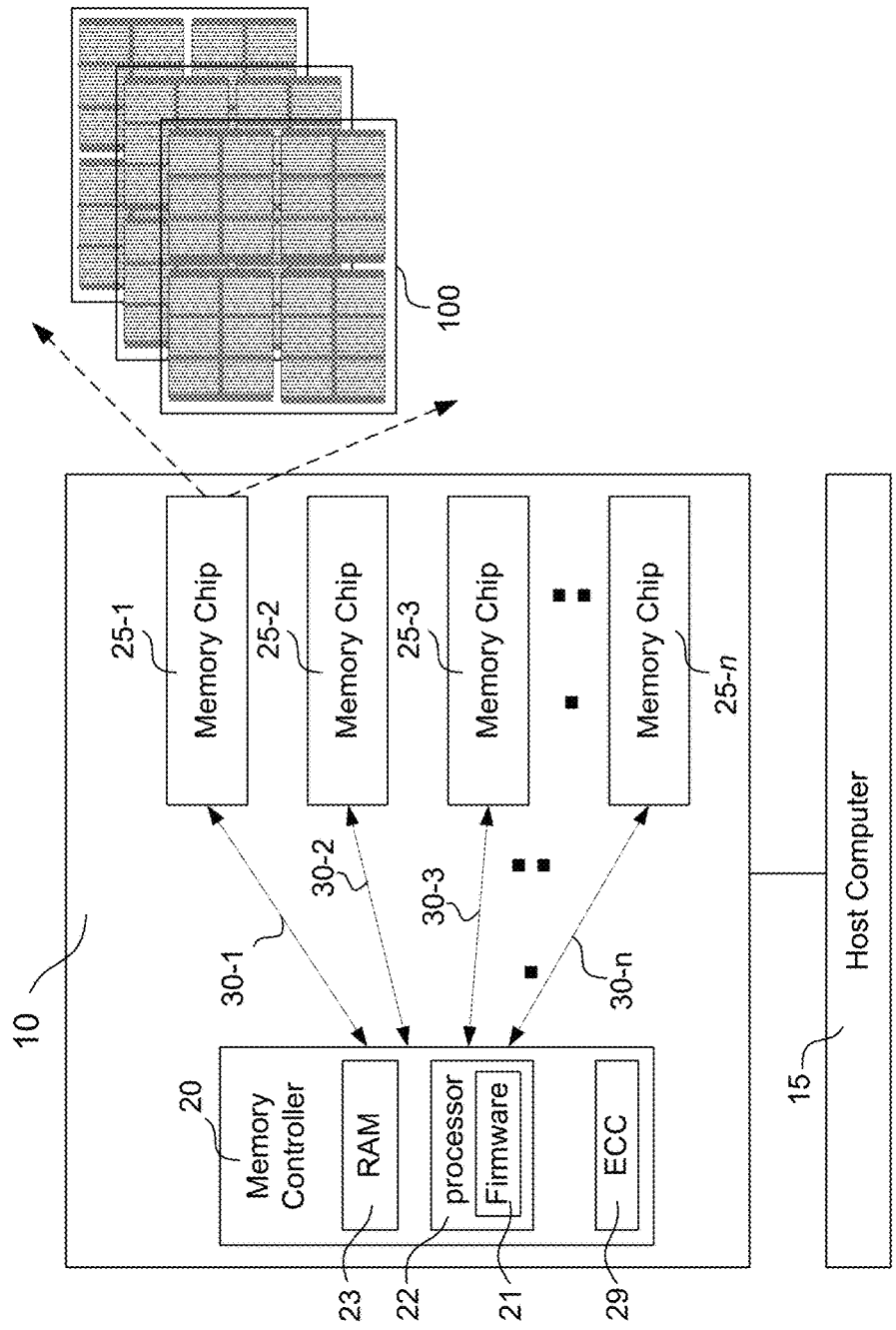
FIGS. 1 and 2A-2B illustrate a storage system with one or more memory chips, according to some embodiments.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements.

Aspects of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure, or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures, or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and can, instead, allow for existence of additional factors not necessarily expressly described, again, depending at least in part on context.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, there above, and/or there below. A layer can include multiple layers. For example, an interconnect layer can include one or more conductive and contact layers (in which contacts, interconnect lines, and/or vertical interconnect accesses (VIAs) are formed) and one or more dielectric layers.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the terms "about" or "approximately" indicate the value of a given quantity that can vary based on a particular technology node associated with the subject semiconductor device. Based on the particular technology node, the terms "about" or "approximately" can indicate a value of a given quantity that varies within, for example, 10-30% of the value (e.g., ±10%, ±20%, or ±30% of the value).

Currently, in memory devices, especially in high density memory devices, threshold voltage (Vt) distribution shift can be impacted by many factors, such as programmed cells charge loss with over time, noises, long NAND's service lift, etc., thus is a common and critical problem. After Vt distribution shift, the pre-defined read level cannot track Vt distribution, thereby causing read fails. A system and method for performing a read operation in a NAND memory, to track Vt distribution is needed.

FIG. 1 illustrates a block diagram of an electronic device S1 having a storage system 10, according to some embodiments. In some embodiments, the electronic device S1 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. Storage system 10 (e.g., a NAND storage system) can include a memory controller 20 and one or more semiconductor memory devices 25-1, 25-2, 25-3, . . . , 25-n. Each semiconductor memory device 25 (hereafter just "memory device") can be a NAND device (e.g., "flash," "NAND flash" or "NAND"). Storage system 10 can communicate with a host 15 through memory controller 20, where memory controller 20 can be connected to one or more memory chips 25-1, 25-2, 25-3, . . . , 25-n, via one or more memory channels 30-1, 30-2, 30-3, . . . , 30-n. In some embodiments, each memory device 25 can be managed by memory controller 20 via one or more memory channels 30-1, 30-2, 30-3, . . . , 30-n.

In some embodiments, host 15 can include a processor of an electronic device, such as a central processing unit (CPU), or a system-on-chip (SoC), such as an application processor (AP). Host 15 can send data to be stored at storage system 10 and/or can retrieve data from stored in storage system 10.

In some embodiments, memory controller 20 can handle I/O requests received from host 15, ensure data integrity and efficient storage, and manage memory device 25. To perform these tasks, memory controller 20 can run firmware 21, which can be executed by one or more processors 22 (e.g., micro-controller units, CPU) of memory controller 20. For example, memory controller 20 can run firmware 21 to map logical addresses (e.g., address utilized by the host associated with host data) to physical addresses in memory device 25 (e.g., actual locations where the data is stored). Memory controller 20 also runs firmware 21 to manage defective memory blocks in the memory device 25, where the firmware 21 can remap the logical address to a different physical address, i.e., move the data to a different physical address. Memory controller 20 can also include one or more memories 23 (e.g., DRAM, SRAM, EPROM, etc.), which can be used to store various metadata used by the firmware 21. In some embodiments, the memory controller 20 can also perform error recovery through an error correction code (ECC) engine 29. ECC is used to detect and correct the raw bit errors that occur within each memory device 25.

In some embodiments, the memory channels 30 can provide data and control communication between the memory controller 20 and each memory device 25 via a data bus. The memory controller 20 can select one of the memory device 25 according to a chip enable signal.

In some embodiments, each memory device 25 in FIG. 1 can include one or more memory devices 100, where each memory device can be a NAND memory.

Figure 2B:
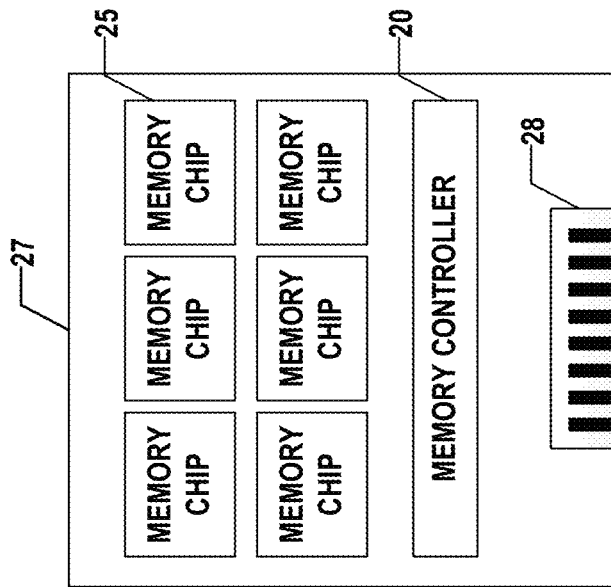
Figure 2A:
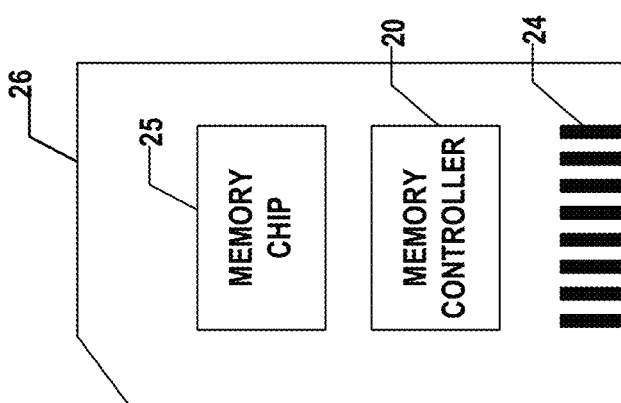

In some embodiments, memory controller 20 and one or more memory device 25 can be integrated into various types of storage devices, for example, be included in the same package, such as a universal Flash storage (UFS) package or an cMMC package. That is, storage system 10 can be implemented and packaged into different types of end electronic products. In one example as shown in FIG. 2A, memory controller 20 and a single memory device 25 can be integrated into a memory card 26. Memory card 26 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 26 can further include a memory card connector 24 coupling memory card 26 with a host (e.g., the host 15 in FIG. 1). In another example as shown in FIG. 2B, memory controller 20 and multiple memory devices 25 can be integrated into a solid state drive (SSD) 27. SSD 27 can further include a SSD connector 28 coupling SSD 27 with a host (e.g., the host 15 in FIG. 1).

Figure 3:
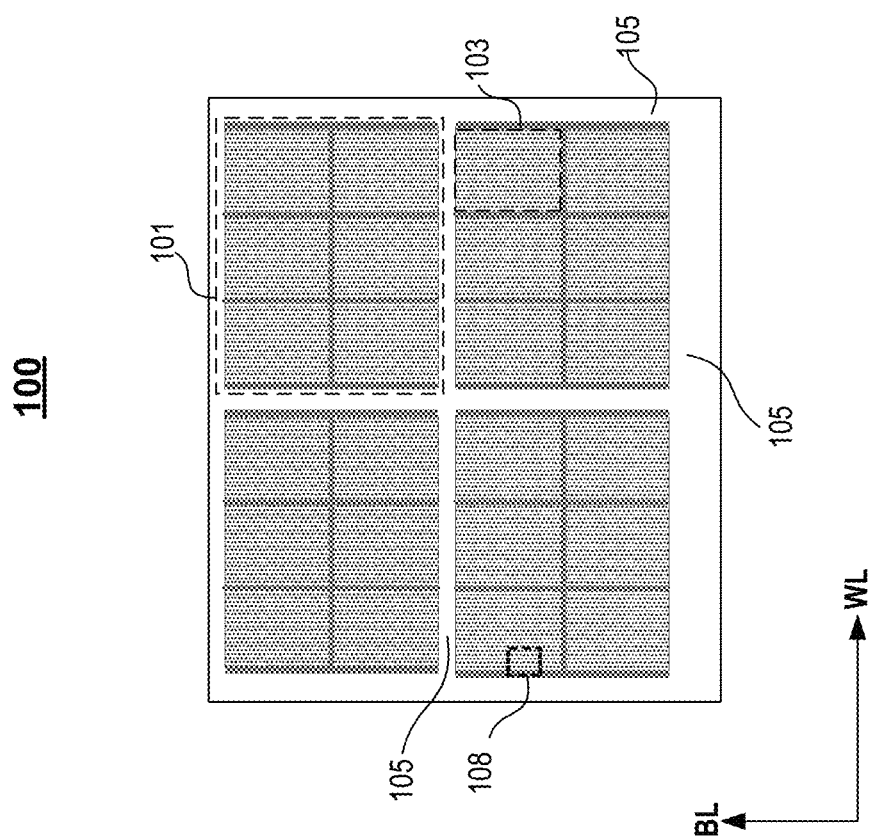
FIG. 3 illustrates a schematic diagram of a memory device, according to some embodiments.

FIG. 3 illustrates a top-down view of a memory device 100, according to some embodiments. The example configuration shown in FIG. 3 is given as a non-limiting example and it is to be appreciated that memory is scalable. In some embodiments, memory device 100 can include one or more memory planes 101, each of which can include a plurality of memory blocks 103. Identical and concurrent operations can take place at each memory plane 101.

Memory block 103, which can be megabytes (MB) in size, is the smallest size to carry out erase operations. Memory device 100 can include, for example, four memory planes 101. Each memory plane 101 can include, for example, six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIG. 3.

In some embodiments, memory device 100 can also include a periphery region 105, an area surrounding memory planes 101. The periphery region 105 can include many digital, analog, and/or mixed-signal circuits to support functions of the memory device, for example, page buffers, row and column decoders and sense amplifiers. Peripheral circuits use active and/or passive semiconductor devices, such as transistors, diodes, capacitors, resistors, etc., as would be apparent to a person of ordinary skill in the art.

In some embodiments, the arrangement of the memory planes 101 in the memory device 100 and the arrangement of the memory blocks 103 in each memory plane 101 illustrated in FIG. 3 are only used as an example, which does not limit the scope of the present disclosure.

Figure 4:
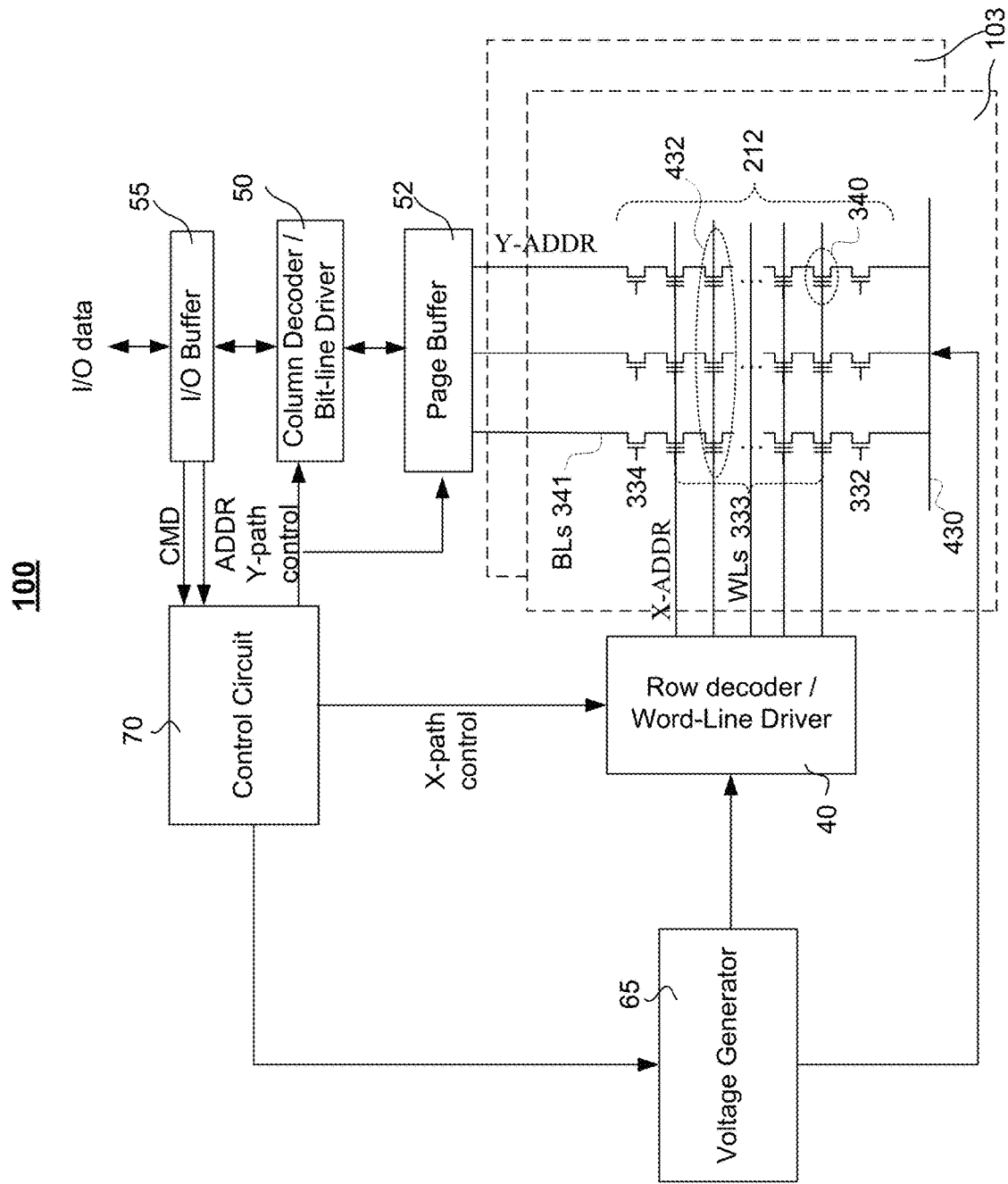
FIG. 4 illustrates a schematic of a memory device, according to some embodiments.

FIG. 4 illustrates a schematic diagram of the memory device 100, according to some embodiments. In some embodiments, memory device 100 can include one or more memory blocks 103 (e.g., 103-1, 103-2, 103-3). Each memory block 103 can include a plurality of memory strings 212. Each memory string 212 includes a plurality of memory cells 340. Memory cells 340 sharing the same word line forms a memory page 432. Memory string 212 can also include at least one field effect transistor (e.g., MOSFET) at each end, which is controlled by a lower select gate ("LSG") 332 and a top select gate ("TSG") 334, respectively. Lower select gates ("LSGs") can also be referred to as bottom select gates ("BSGs"). The drain terminal of the top select transistor 334-T can be connected to a bit line 341, and the source terminal of the lower select transistor 332-T can be connected to an array common source ("ACS") 430. ACS 430 can be shared by the memory strings 212 in an entire memory block, and is also referred to as the common source line.

In some embodiments, memory device 100 can also include a periphery circuit that can include many digital, analog, and/or mixed-signal circuits to support functions of the memory block 103, for example, a page buffer 52, a row decoder/word line driver 40, a column decoder/bit line driver 50, a controller 70, a voltage generator 65 and an input/output buffer 55. Controller 70 can include one or more control circuits. In some aspects, controller 70 can include one or more registers, buffers, and/or memories to store one or more trim settings as described in the present disclosure. These circuits can include active and/or passive semiconductor devices, such as transistors, diodes, capacitors, resistors, etc., as would be apparent to a person of ordinary skill in the art.

In some embodiments, memory blocks 103 can be coupled with the row decoder/word line driver 40 via word lines ("WLs") 333, lower select gates ("LSGs") 332 and top select gates ("TSGs") 334. Memory blocks 103 can be coupled with page buffer 52 via bit lines ("BLs") 341. Row decoder/word line driver 40 can select one of the memory blocks 103 on the memory device 100 in response to an X-path control signal provided by the controller 70. Row decoder/word line driver 40 can transfer voltages provided from the voltage generator 65 to the word lines according to the X-path control signal. During the read and program operation, the row decoder/word line driver 40 can transfer a read voltage $V_{read}$ and a program voltage $V_{pgm}$ to a selected word line and a pass voltage $V_{pass}$ to an unselected word line according to the X-path control signal received from the controller 70.

In some embodiments, column decoder/bit line driver 50 can transfer an inhibit voltage $V_{inhibit}$ to an unselected bit line and connect a selected bit line to ground according to a Y-path control signal received from controller 70. In the other words, column decoder/bit line driver 50 can be configured to select or unselect one or more memory strings 212 according to the Y-path control signal from controller 70. The page buffer 52 can be configured to read and program (write) data from and to the memory block 103 according to the control signal Y-path control from the controller 70. For example, the page buffer 52 can store one page of data to be programmed into one memory page 432. In another example, page buffer 52 can perform verify operations to ensure that the data has been properly programmed into each memory cell 340. In yet another example, during a read operation, page buffer 52 can sense current flowing through the bit line 341 that reflects the logic state (i.e., data) of the memory cell 340 and amplify small signal to a measurable magnification.

In some embodiments, in order to increase the efficiency of a write operation, column decoder/bit line driver 50 can transfer a bias voltage $V_{bias}$ to a selected bit line according to a Y-path control signal from controller 70 and the data to be programmed from page buffer 52.

In some embodiments, input/output buffer 55 can transfer the I/O data from/to the page buffer 52 as well as addresses ADDR or commands CMD to the controller 70. In some embodiments, input/output buffer 55 can function as an interface between memory controller 20 (in FIG. 1) and memory device 100 on memory device 25.

In some embodiments, controller 70 can control page buffer 52 and row decoder/word line driver 40 in response to the commands CMD transferred by the input/output buffer 55. During the program operation, controller 70 can control row decoder/word line driver 40 and page buffer 52 to program a selected memory cell. During the read operation, controller 70 can control row decoder/word line driver 40 and the page buffer 52 to read a selected memory cell. The X-path control signal and the Y-path control signal include a row address X-ADDR and a column address Y-ADDR that can be used to locate the selected memory cell in the memory block 103. The row address X-ADDR can include a page index PD, a block index BD and a plane index PL to identify memory page 432, memory block 103, and memory plane 101 (in FIG. 3), respectively. The column address Y-ADDR can identify a byte or a word in the data of the memory page 432.

In some embodiments, voltage generator 65 can generate voltages to be supplied to word lines and bit lines under the control of controller 70. The voltages generated by voltage generator 65 include the read voltage $V_{read}$, the program voltage $V_{pgm}$, the pass voltage $V_{pass}$, the inhibit voltage $V_{inhibit}$, the bit line bias voltage $V_{bias}$, etc.

It is noted that the arrangement of the electronic components in the storage system 10 and the memory device 100 in FIGS. 1, 2A-2B, and 3-4 are shown as non-limiting examples. In some embodiments, storage system 10 and memory device 100 can have other layout and can include additional components. Components (e.g., controller 70, I/O buffer 55) on memory device 100 shown in FIG. 4 can also be moved off memory device 100, as a stand-alone electric component in the storage system 10. Components (e.g., controller 70, I/O buffer 55) on memory device 100 shown in FIG. 4 can also be moved to other components in storage system 10, for example, a portion of controller 70 can be combined with memory controller 20 and vice versa.

Figure 5:
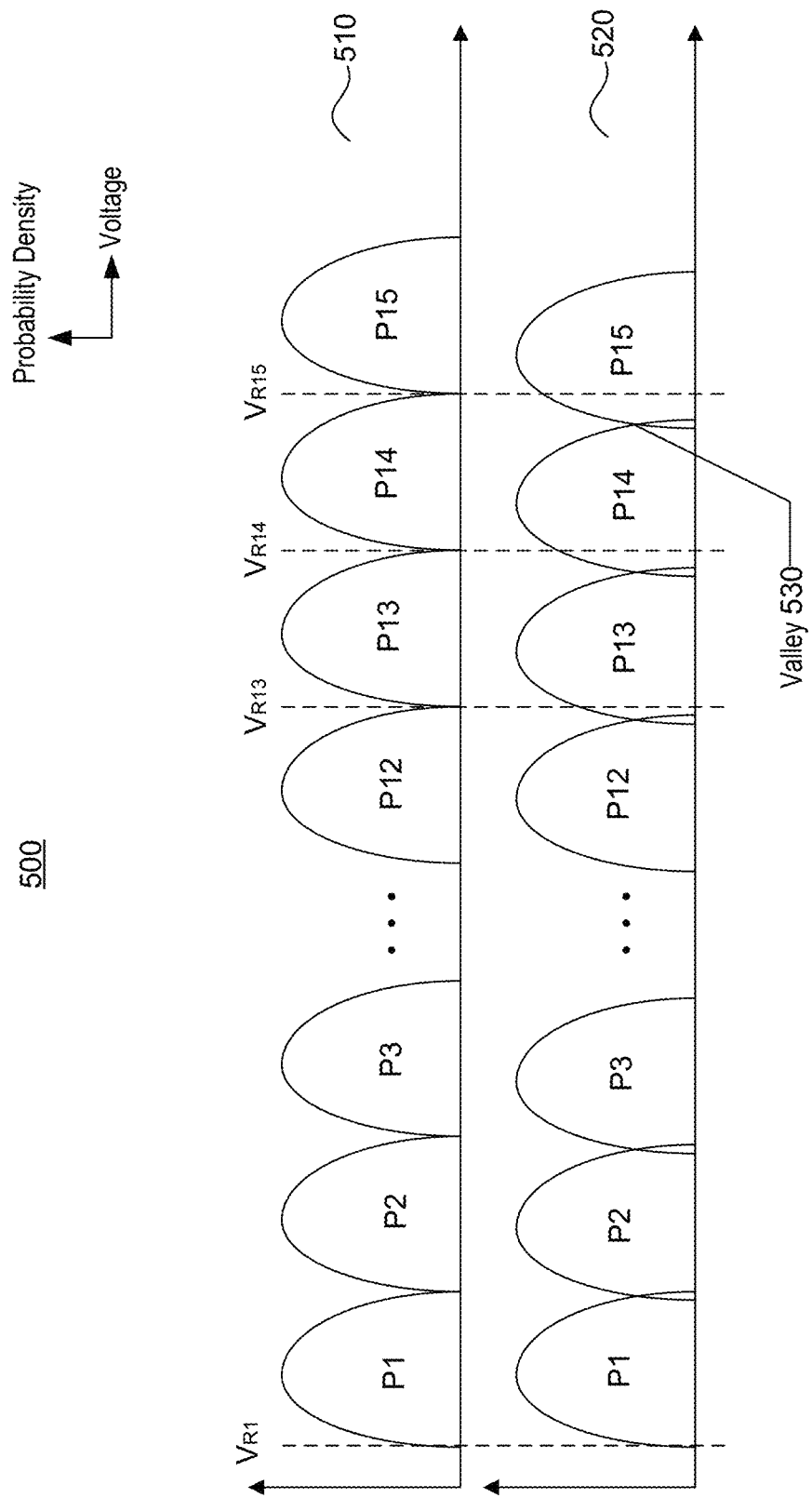
FIG. 5 illustrates a schematic diagram of an exemplary threshold voltage distribution of a memory device, according to some embodiments.

FIG. 5 illustrates a schematic diagram of an exemplary threshold voltage distribution of a memory device, according to some embodiments.

Referring back to FIG. 4, in some embodiments, memory block 103 can be formed based on floating gate technology. In some embodiments, the memory block 103 can be formed based on charge trapping technology. The NAND flash memory based on charge trapping can provide high storage density and high intrinsic reliability. Storage data in the form of logic states ("states," e.g., threshold voltages Vth of the memory cell 340) depends on the number of charge carriers trapped in the memory film of the memory cell 340.

In some embodiments, in a NAND flash memory, a read operation and a write operation (also referred to as program operation) can be performed for the memory page 432, and an erase operation can be performed for the memory block 103.

In some embodiments, in a NAND memory, the memory cell 340 can be in an erased state ER or a programmed state P1. Initially, memory cell 340 in memory block 103 can be reset to the erased state ER as logic "1" by implementing a negative voltage difference between control gates 333 and channel such that trapped charge carriers in the memory film of memory cells 340 can be removed. For example, the negative voltage difference can be induced by setting control gates 333 of memory cells 340 to ground, and applying a high positive voltage (an erase voltage Verase) to ACS 430. At the erased state ER ("state ER"), the threshold voltage Vth of memory cells 340 can be reset to the lowest value.

In some embodiments, during programming (i.e., writing), a positive voltage difference between control gates 333 and channel can be established by, for example, applying a program voltage Vpgm (e.g., a positive voltage pulse between 10 V and 20 V) on control gate 333, and grounding the corresponding bit line 341. As a result, charge carriers (e.g., electrons) can be injected into the memory film of memory cell 340, thereby increasing the threshold voltage Vth of memory cell 340. Accordingly, memory cell 340 can be programmed to the programmed state P1 ("state P1" or logic "0").

In some embodiments, the state of the memory cell (e.g., state ER or state P1) can be determined by measuring or sensing the threshold voltage Vth of the memory cell. During a read operation, a read voltage Vread can be applied on control gate 333 of the memory cell and current flowing through the memory cell can be measured at bit line 341. A pass voltage Vpass can be applied on unselected word lines to switch on unselected memory cells.

In some embodiments, a NAND flash memory can be configured to operate in a single-level cell (SLC) mode. To increase storage capacity, a NAND flash memory can also be configured to operate in a multi-level cell (MLC) mode, a triple-level cell (TLC) mode, a quad-level cell (QLC) mode, or a combination of any of these modes. In the SLC mode, a memory cell stores 1 bit and has two logic states, logic {1 and 0}, i.e., states ER and S1. In the MLC mode, a memory cell stores 2 bits, and has four logic states, logic {11, 10, 01, and 00}, i.e., states ER, M1, M2, and M3. In the TLC mode, a memory cell stores 3 bits, and has eight logic states, logic {111, 110, 101, 100, 011, 010, 001, 000}, i.e., states ER, and states T1-T7. In the QLC mode, a memory cell stores 4 bits and has 16 logic states, logic {1111, 1110, 1101, 1100, 1011, 1010, 1001, 1000, 0111, 0110, 0101, 0100, 0011, 0010, 0001, 0000}, i.e., states ER, and states Q1-Q15. Memory controller 20 of storage system 10 (see FIG. 1) can convert data received from host 15 into corresponding logic states of the memory cells on memory devices 100 and vice versa.

In some aspects of the QLC mode, states P1-P15 corresponds to states Q1-Q15. In some aspects, each state of the memory cells can correspond to a specific range of threshold voltage $V_{th}$, where the threshold voltage $V_{th}$ distribution of each state can be represented by a probability density. In some aspects, the states other than the erased state ER can be programmed by using an incremental step pulse programming (ISPP) scheme where the programming voltage $V_{pgm}$ can be incrementally increased by adding a step pulse $V_{step}$. For example, the QLC states can be programmed from state ER with a lower threshold voltage to state Q15 with a highest threshold voltage.

In some aspects, after programming, states P1-P15 can be verified by using one or more pre-defined read reference voltages, during a verification process. By applying one or more of the pre-defined read reference voltages to the control gate of a target memory cell, the range of the memory cell's threshold voltage $V_{th}$ can be determined.

For example, to verify if a memory cell is at state ER, the read reference voltage $V_{R1}$ can be used. If the target memory cell is at state ER, the threshold voltage $V_{th}$ of the target memory cell is lower than the read reference voltage $V_{R1}$. The target memory cell can be switched on and form a conductive path in the channel. If the target memory cell is at any one of the states P1-P15, the threshold voltage $V_{th}$ of the target memory cell is higher than the pre-defined read reference voltage $V_{R1}$. The target memory cell is thereby switched off. By measuring or sensing the current through the target memory cell at the corresponding bit line, via the page buffer 52, the threshold voltage $V_{th}$ or the state of the target memory cell can be verified.

In some aspects, as shown in diagram 510, to determine the states ER and P1-P15 for the QLC mode, the pre-defined read reference voltages, for example, including, $V_{R1}$, $V_{R13}$, $V_{R14}$ and $V_{R15}$, can be used. For example, in the QLC mode, the threshold voltage of state ER is below $V_{R1}$, and the threshold voltage of state P15 is above $V_{R15}$, where the threshold voltages of state P14 is between $V_{R14}$ and $V_{R15}$ and the threshold voltages of state P13 is between $V_{R13}$ and $V_{R14}$.

In some aspects, as shown in diagram 520, the threshold voltage $V_{th}$ distribution of each state of P1-P15 may shift over time. As shown in diagram 520, the change of a threshold voltage distribution of memory cells may be differently illustrated according to a programmed state. For example, in the case of a lower program state P1, P2 and P3 a distribution may tend to shift to the slight right side. Moreover, in the case of upper program states P12, P13, P14 and P15, the distribution may tend to spread in the slight left side. By applying one or more of the pre-defined read reference voltages, including for example, $V_{R1}$, $V_{R13}$, $V_{R14}$ and $V_{R15}$, to the control gate of the target memory cell, the range of the memory cell's threshold voltage Vth may not be determined appropriately. In some aspects, a valley may include an intersection between a first threshold voltage distribution of a first state and a second threshold voltage distribution of a second state. The second state may include an adjacent or a neighboring state of the first state. For example, valley 530 may include an intersection between a threshold voltage distribution of a program state P14 and a threshold voltage distribution of a program state P15.

In memory devices, especially in high density memory devices, threshold voltage (Vt) distribution shift can be impacted by many factors, such as programmed cells charge loss with over time, noises, long NAND's service lift, etc., thus is a common and critical problem. After Vt distribution shift, the pre-defined read level cannot track Vt distribution, thereby causing read fails.

Figure 6A:
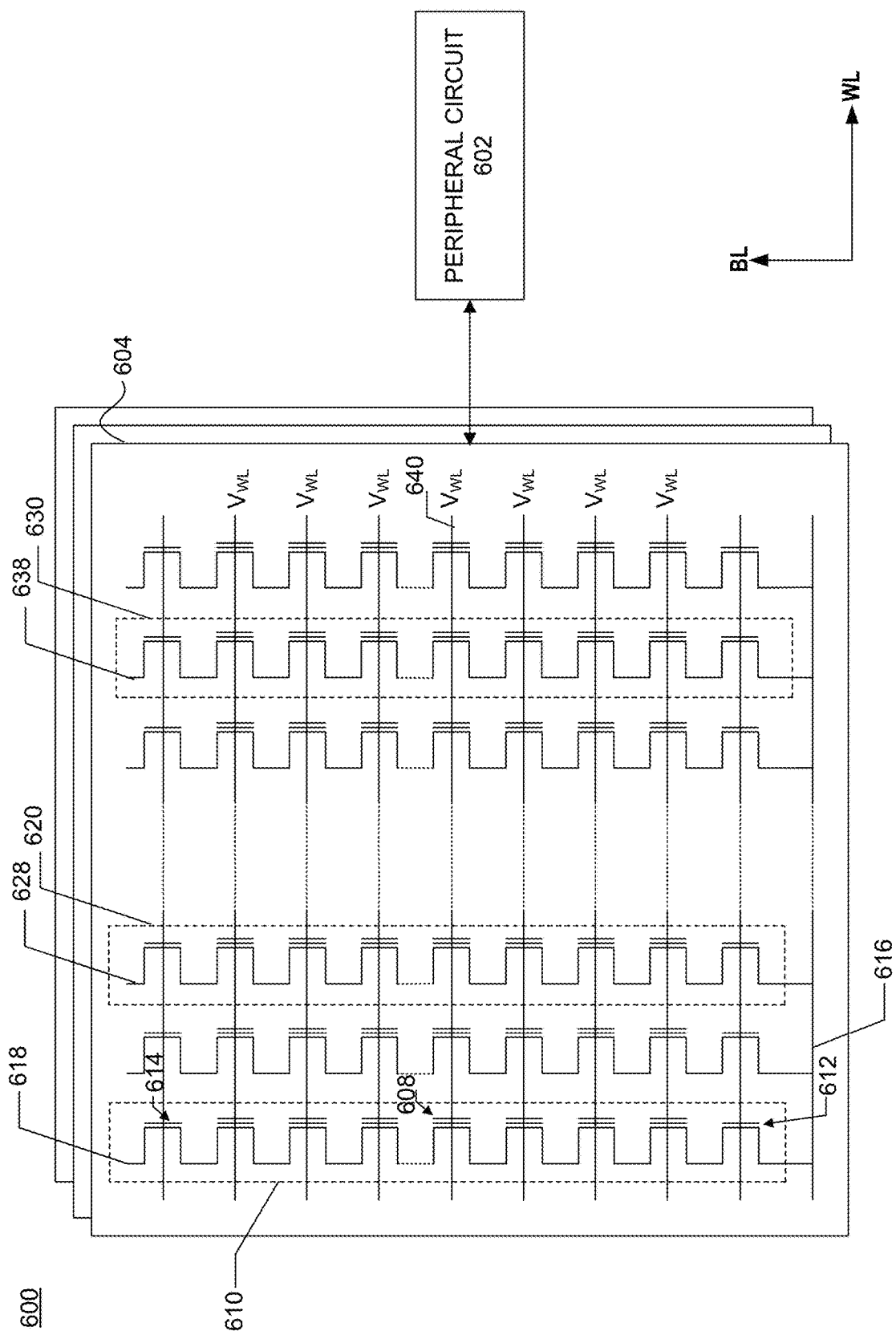
FIG. 6A illustrates an example schematic circuit diagram of a memory device, according to some embodiments.

FIG. 6A illustrates an example schematic circuit diagram 600 of a memory device, according to aspects of the present disclosure. The example schematic circuit diagram 600 includes a memory block 604 and a peripheral circuit 602. In some aspects, the example schematic circuit diagram 600 includes a plurality of memory strings 610, 620 and 630, with each of memory strings 610, 620 and 630 having a plurality of memory cells 608. The memory string 610 also includes at least one field effect transistor (e.g., MOSFET) at each end, which is controlled by a lower select gate (LSG) 612 and a top select gate (TSG) 614, respectively. The memory cell 608 can be controlled by a control gate, where the control gate can be connected to a word line 640 of the example schematic circuit diagram 600. The drain terminal of the TSG 614 can be connected to the bit line 618, and the source terminal of the LSG 612 can be connected to an array common source (ACS) 616. The ACS 616 can be shared by the memory strings 610 in an entire memory block, and is also referred to as the common source line. In some examples, memory string 620 can be associated with bit line 628 and memory string 630 can be associated with bit line 638.

In some aspects, the example schematic circuit diagram 600 can be formed based on the floating gate technology. In some aspects, the example schematic circuit diagram 600 can be formed based on charge trapping technology. The NAND flash memory based on charge trapping can provide high storage density and high intrinsic reliability. Storage data or logic states (e.g., threshold voltage $V_{th}$ of the memory cell 608) depends on the amount of charge trapped in a storage layer. In some aspects, the memory block 604 can be a three-dimensional (3D) memory device, and the example schematic circuit diagram 600 can be a 3D memory array, where the memory cells 608 can be vertically stacked on top of each other.

In a NAND memory, the memory cell 608 can be in an erase state ER or a programmed state P1. Initially, all memory cells 608 in the example schematic circuit diagram 600 can be reset to the erase state ER as logic "1" by implementing a negative voltage difference between control gates and source terminals of the memory cells (e.g., the array common source 616) such that all the trapped electronic charges in the storage layer of the memory cells 608 can be removed. For example, the negative voltage difference can be induced by setting the control gates of the memory cells 608 to ground, and applying a high positive voltage to the array common source 616. At the erase state ER ("state ER"), the threshold voltage $V_{th}$ of the memory cells 608 can be reset to the lowest value, and can be measured or sensed at the bit line 618.

During programming (i.e., writing), a programming voltage $V_{pgm}$ (e.g., a positive voltage pulse between 10 V and 20 V) can be applied on the control gate such that electronic charges (e.g., electrons) can be injected into the storage layer of the memory cell 608, and thereby increase the threshold voltage $V_{th}$ of the memory cell 608. Thus, the memory cell 608 is programmed to the state P1. In some examples, memory cell 608 may be programmed to different states, such as P2-P15 in QLC mode.

Figure 6B:
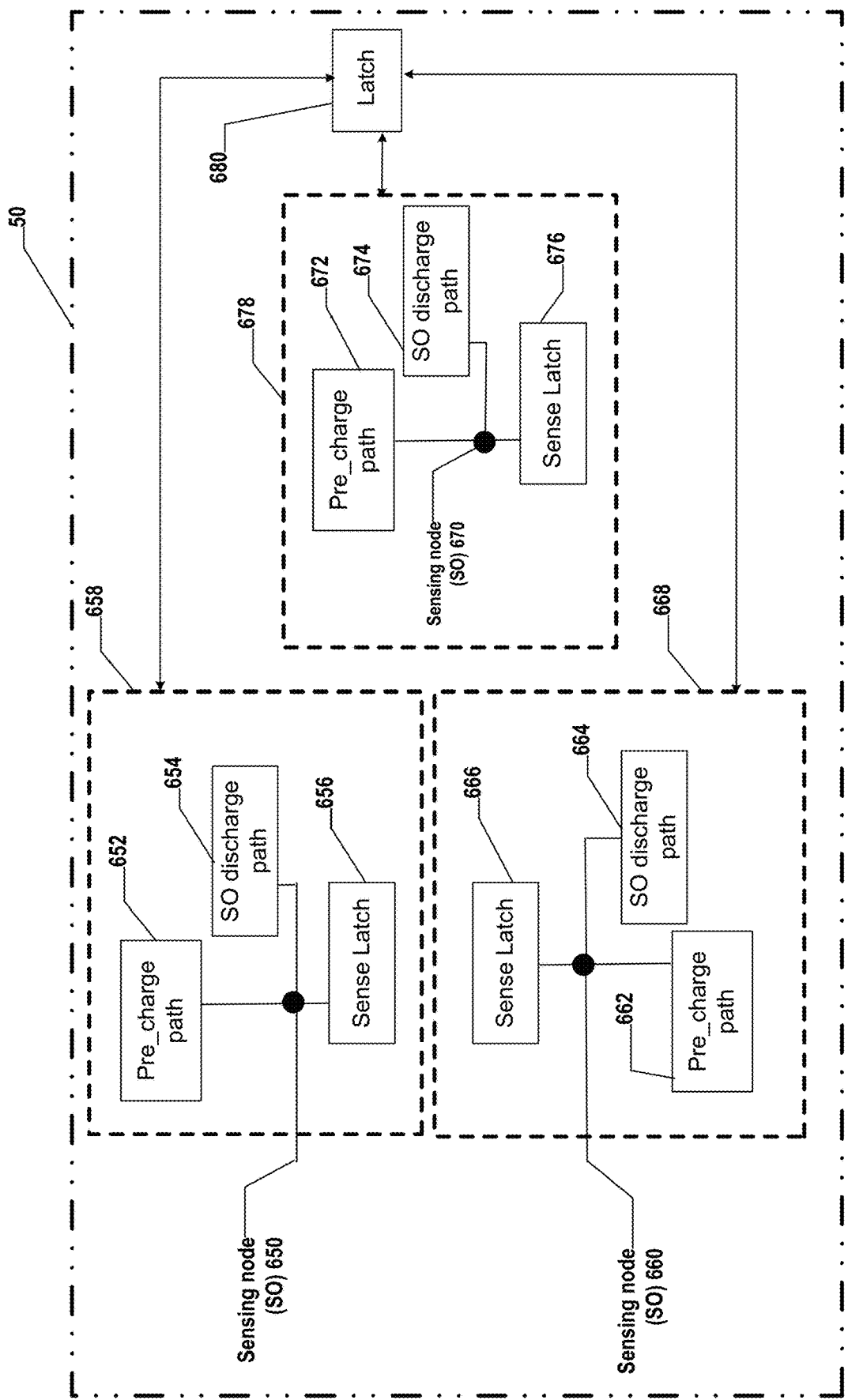
FIG. 6B illustrates an example schematic diagram of a page buffer of a memory device, according to some embodiments.

FIG. 6B illustrates an example schematic diagram of a page buffer of a memory device, according to some embodiments. FIG. 6B can be described with regard to page buffer 52 of FIG. 4 and elements of FIGS. 1-6A. Not all of the depicted components may be used, however, and one or more implementations may include additional components not shown in the figure. Variations in the arrangement and types of the components may be made without departing from the spirit or scope of the claims as set forth herein. Additional, different or fewer components may be provided.

As illustrated in FIG. 6B, page buffer 52 includes a first page buffer structure 658, a second page buffer structure 668, a third page buffer structure 678, and a latch 680. Latch 680 is connected with first page buffer structure 658, second page buffer structure 668, and third page buffer structure 678 to perform a read operation of a memory device (e.g., memory device 100). In some examples, first page buffer structure 658 may be connected with memory string 610 through bit line 618 of FIG. 6A. In some examples, second page buffer structure 668 may be connected with memory string 620 through bit line 628 of FIG. 6A. In some examples, third page buffer structure 678 may be connected with memory string 630 through bit line 638 of FIG. 6A.

As shown in FIG. 6B, first page buffer structure 658 includes a sensing node (SO) 650, a pre-charge path 652, a SO discharge path 654 and a sense latch 656. Second page buffer structure 668 includes a sensing node (SO) 660, a pre-charge path 662, a SO discharge path 664 and a sense latch 666. Third page buffer structure 678 includes a sensing node (SO) 670, a pre-charge path 672, a SO discharge path 674 and a sense latch 676.

As described with reference to FIG. 4, during a read operation, the row decoder/word line driver 40 can transfer a read voltage Vread to a selected word line to an unselected word line according to the X-path control signal received from the controller 70. The page buffer 52 can be configured to read data from and to the memory block 103 according to the control signal Y-path control from the controller 70. During the read operation, page buffer 52 can sense current flowing through the bit line 341 that reflects the logic state (i.e., data) of the memory cell 340 and amplify small signal to a measurable magnification.

During a read operation, first page buffer structure 658 may precharge bit line 618 through pre-charge path 652 by a control logic (e.g., control circuit 70) and may sense at SO 650 whether a selected memory cell is turned on or off. Second page buffer structure 668 and third page buffer structure 678 may respectively precharge bit lines connected thereto based on the same procedure as the precharging operation of the above-described first page buffer structure 658.

During a read operation, bit line 618 and SO 650 may be precharged to a pre-determined level during a pre-charge period. A current can be generated (e.g., in a channel) so as to flow into first page buffer structure 658 through the bit line 618. During a develop period with a develop time, when the selected memory cell is in a first state (e.g., on cell), a charge charged at SO 650 may be discharged to the array common source (ACS) 616 through bit line 618 and the channel of a cell string through SO discharge path 654. In this case, because the current flowing to first page buffer structure 658 is relatively great, the speed of a voltage drop of SO 650 may be relatively fast. On the other hand, during the develop period with the develop time, when the selected memory cell is in a second state (e.g., off cell), it may be difficult for a charge charged at SO 650 to be discharged to ACS 616 through bit line 618. Accordingly, because the current flowing to first page buffer structure 658 is relatively small, the speed of a voltage drop of SO 650 may be relatively slow.

During a latch period, a state of SO 650 associated with the selected memory cell may be latched to sense latch 656 as a first state of the selected memory cell with a logical value of 1. Alternatively, a state of SO 650 associated with the selected memory cell may be latched to sense latch 656 as a second state of the selected memory cell with a logical value of 0. In some examples, a threshold voltage of the selected memory cell in the first state is larger than a read voltage in the read operation and a threshold voltage of the selected memory cell in the second state is smaller than a read voltage in the read operation. In some examples, a memory cell is in the first state when the memory cell is turned on when a read voltage level is applied, and a memory cell is in the second state when the memory cell is turned off when a read voltage level is applied.

In some examples, second page buffer structure 668 and third page buffer structure 678 may respectively discharge bit lines connected thereto and sense a state of sensing node as a first state or a second state of the selected memory cell based on the same procedure as the operations of the above-described first page buffer structure 658.

After the latch period, latch 680 may store the data associated with each of sense latch 656, sense latch 666, and sense latch 676. Latch 680 may perform one or more modification on the stored data associated with each of sense latch 656, sense latch 666, and sense latch 676. In some examples, latch 680 may modify the logical value of the data associated with each of sense latch 656, sense latch 666, and sense latch 676. For example, latch 680 may modify the logical value of 1 to the logical value of 0. Alternatively, latch 680 may modify the logical value of 0 to the logical value of 1.

In some examples, during a read operation, a develop time during the develop period may be different for each of first page buffer structure 658, second page buffer structure 668 and third page buffer structure 678. The sensing node, pre-charge path, SO discharge path and sense latch associated with each of first page buffer structure 658, second page buffer structure 668 and third page buffer structure 678 can be controlled separately in different configurations.

Figure 7:
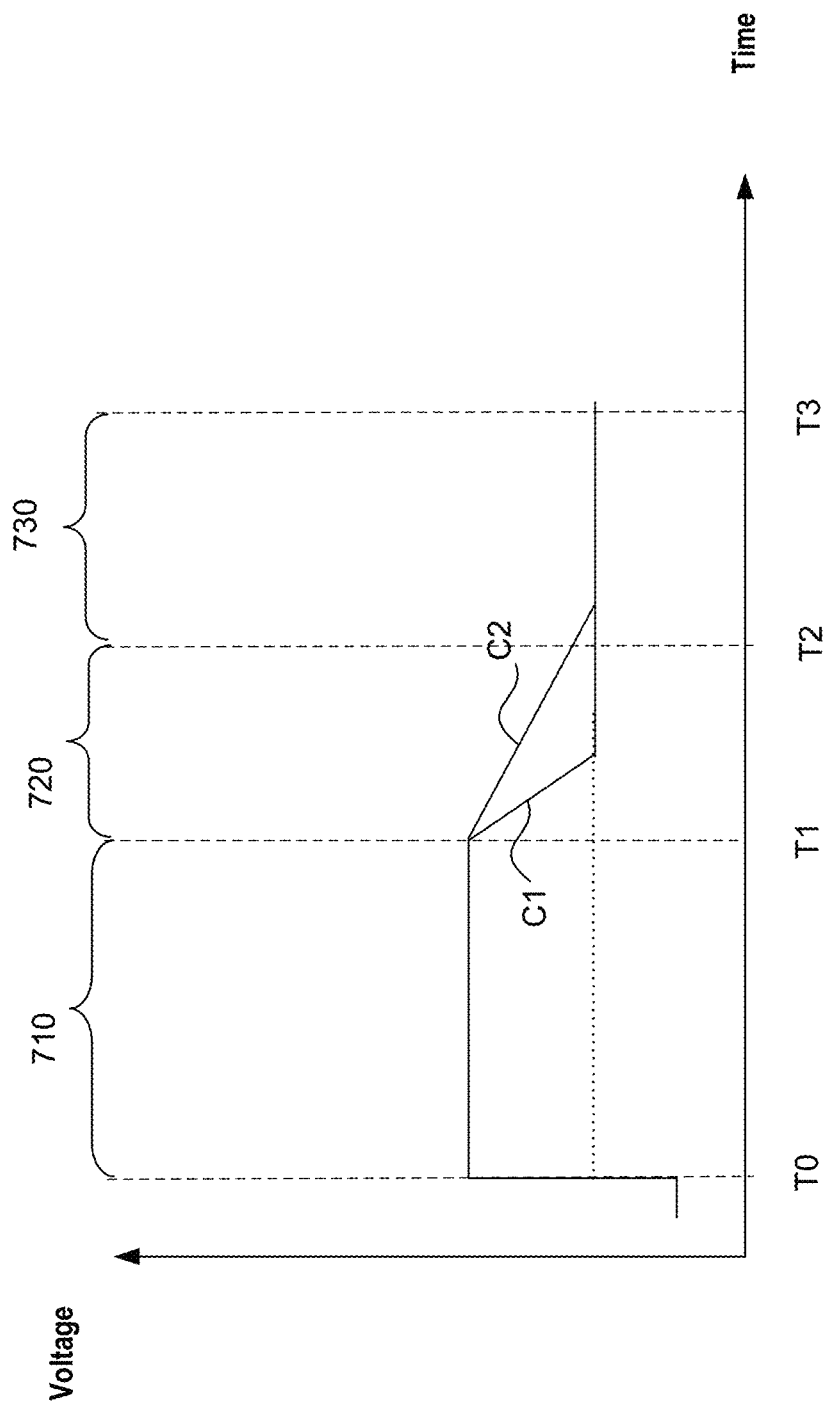
FIG. 7 illustrates an exemplary signal waveform illustrating a voltage level of a sensing node of FIG. 6B, according to some embodiments.

FIG. 7 illustrates an exemplary signal waveform illustrating a voltage level of a sensing node of FIG. 6B, according to some embodiments. FIG. 7 can be described with regard to sensing node 650, 660 or 670 of FIG. 6 and elements of FIGS. 1-6B. Not all of the depicted components may be used, however, and one or more implementations may include additional components not shown in the figure. Variations in the arrangement and types of the components may be made without departing from the spirit or scope of the claims as set forth herein. Additional, different or fewer components may be provided.

Referring to FIG. 7, the level change of the sensing node SO (e.g., sensing node 650, 660 or 670) according to a threshold voltage level of a memory cell and a latch result according to a develop period may be briefly illustrated. A time period 710 from time T0 to time T1 may be referred to as the precharge period as discussed with reference to FIG. 6B, a time period 720 from time T1 to time T2 may be referred to as a develop period as discussed with reference to FIG. 6B. During the develop period, the change of a voltage level of the sensing node SO about a strong on cell may correspond to a curve C1. The strong on cell or a strong off cell may not be significantly affected by the slight change of the develop time. The voltage change of the sensing node SO for sensing memory cells may correspond to curve C2, and a threshold voltage of each of the memory cells may be placed near a read voltage. The curve C2 illustrates a develop slope of a memory cell having a threshold voltage slightly lower than the read voltage. A time period 730 between time T2 and T3 may be referred to as the sense period as discussed with reference to FIG. 6B.

In some examples, in the case of a memory cell having a threshold voltage that is relatively higher than a read voltage, the level change of the sensing node SO may be relatively small. In the case of a memory cell having a threshold voltage that is relatively lower than a read voltage, the level change of the sensing node SO may be relatively great. In some aspects, memory cells with threshold voltages distributed around a valley between a first threshold voltage distribution of a first state and a second threshold voltage distribution of a second state (e.g., valley 530) may be memory cells placed at a boundary between an on cell and an off cell. Accordingly, a distinction between an on cell and an off cell about the memory cells may be changed according to the develop time. That is, even though the develop time slightly decreases, each of the memory cells having threshold voltages distributed around a valley may be determined as an "off cell". On the other hand, even though the develop time slightly increases, each of the memory cells having threshold voltages distributed around a valley may be determined as an "on cell". That is, in memory cells having a threshold voltage level similar to a read voltage level to be provided to a word line, a sensing operation may be performed the same as a sensing operation using a read voltage increased, by reducing a develop time. On the other hand, in memory cells having a threshold voltage level similar to a read voltage level to be provided to a word line, a sensing operation may be performed the same as a sensing operation using a read voltage decreased, by increasing a develop time.

Accordingly, sensing the sensing node SO a plurality of times at a point in time when a develop time is changed may be the same as changing a word line voltage and precharging and sensing a bit line.

Figure 8A:
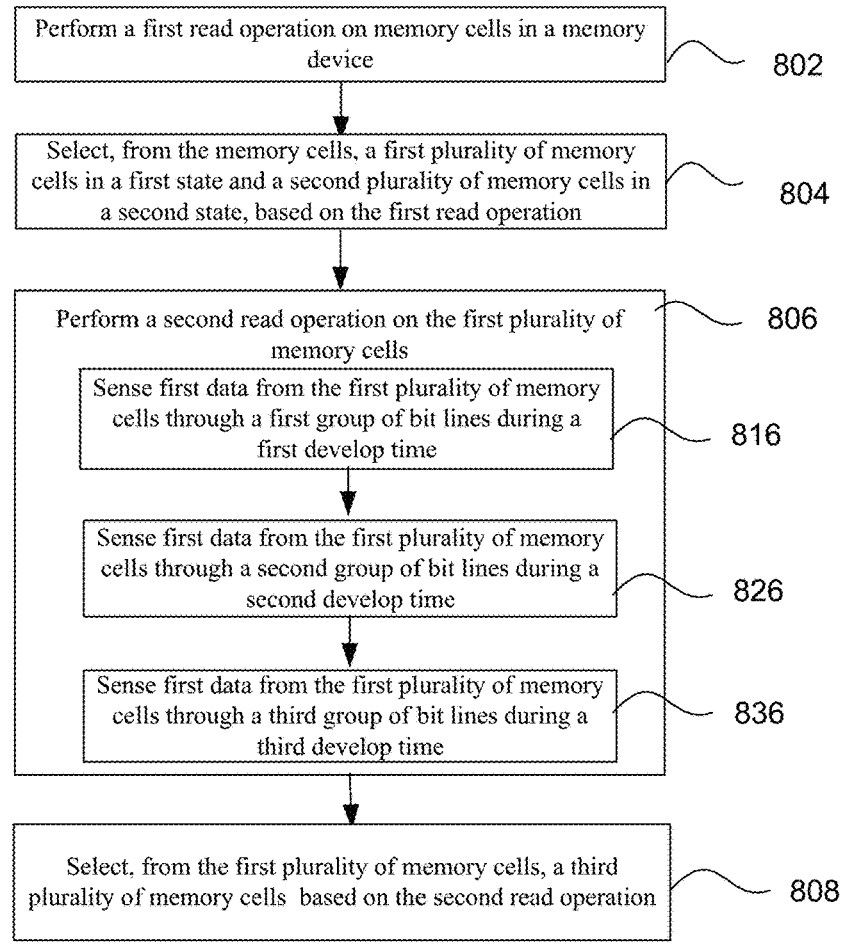
FIG. 8A illustrates an example method 800 of performing a read operation on a memory device, according to some embodiments.
Figure 8A:
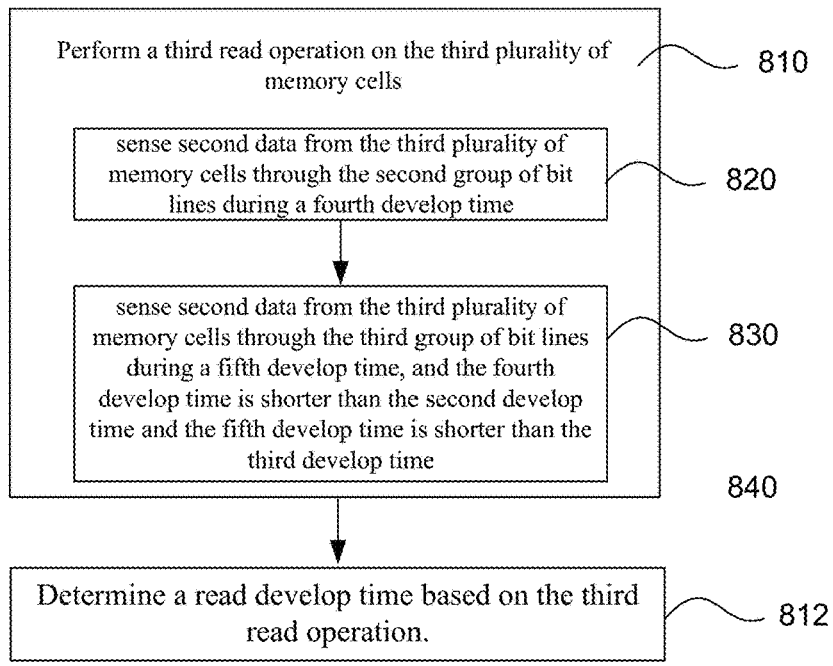

FIG. 8A illustrates an example method 800 of performing a read operation on a memory device, according to some embodiments. FIG. 8A can be described with regard to elements of FIGS. 1-7. The example 800 can be performed by a storage system (for example, the storage system 10 of FIG. 1). It should be appreciated that the process flow 800 is not exhaustive and that other operation steps can be performed as well before, after, or between any of the illustrated operation steps. In some embodiments, some operation steps of the process flow 800 can be omitted or other operation steps can be included, which are not described here for simplicity. In some embodiments, operation steps of the process flow 800 can be performed in a different order and/or vary.

At step 802, a first read operation is performed on memory cells (e.g., memory cell 608) in a memory device (e.g., memory device 100). In some examples, the first operation may include applying a pre-determined read voltage (e.g., $V_{R15}$ in FIG. 5) to determine a state (e.g., P15) of one or more memory cells. In some aspects, as shown in diagram 520, the threshold voltage $V_{th}$ distribution of each state of P1-P15 may shift over time.

At step 804, a first plurality of memory cells in a first state and a second plurality of memory cells in a second state are selected from the memory cells based on the first read operation. In some examples, a threshold voltage of each of the first plurality of memory cells in the first state may be larger than a read voltage in the first read operation and a threshold voltage of each of a second plurality of memory cells in the second state may be smaller than a read voltage in the first read operation. In some examples, the first state of a memory cell may correspond to a logical value of 1 in a sense latch. In some examples, a second state of a memory cell may correspond to a logical value of 0 in a sense latch. In some examples, one or more bit lines or sensing nodes associated with the first plurality of memory cells may be precharged after the first read operation. One or more bit lines or sensing nodes associated with the second plurality of memory cells may not be precharged after the first read operation.

At step 806, a second read operation is performed on the first plurality of memory cells including the steps 816, step 826 and step 836. At step 816, first data from the first plurality of memory cells through a first group of bit lines (e.g., bit line 618) are sensed during a first develop time. In some examples, the first develop time may be associated with the develop period and the sense period as described with reference to FIG. 7. At step 826, first data from the first plurality of memory cells through a second group of bit lines (e.g., bit line 628) are sensed during a second develop time. At step 836, first data from the first plurality of memory cells through a third group of bit lines (e.g., bit line 638) are sensed during a third develop time. In some examples, the first develop time may include a time period, such as "T", the second develop time may include a time period that is twice as the first develop time, such as "2T" and the third develop time may include a time period that is three times as the first develop time, such as "3T". In some examples, the number of develop time may not be limited to three, and may include any number. In some examples, the number of develop time may be selected based on a different number of groups of the bit lines.

In some examples, a first discharge path (e.g., SO discharge path 654) associated with the first group of bit lines may be disabled after the first develop time. In some examples, a second discharge path (e.g., SO discharge path 664) associated with the second group of bit lines may be disabled after the second develop time. In some examples, a third discharge path (e.g., SO discharge path 674) associated with the third group of bit lines, may be disabled after the third develop time, to thereby perform the second read operation on the first plurality of memory cells.

In some examples, the first data corresponding to each of the first plurality of memory cells are latched based on the second read operation to a logical value of one or zero by one or more sense latches (e.g., sense latch 656, 666, and 676). The first data may be transferred to and modified in latch 680. A modified logical value corresponding to each of the first plurality of memory cells may be obtained by latch 680. In some examples, a logical value of one may modified to a logical value of zero. Alternatively, a logical value of zero may modified to a logical value of one.

At step 808, a third plurality of memory cells is selected, from the first plurality of memory cells, based on the second read operation. In some examples, the third plurality of memory cells from the first plurality of memory cells may be selected, based on the modified logical value. In some examples, the modified logical value corresponding to each of the third plurality of memory cells may be one. In some examples, the modified logical value corresponding to each of the third plurality of memory cells may be a predetermined value.

At step 810, a third read operation on the third plurality of memory cells is performed including step 820, and step 830. At step 820, second data from the third plurality of memory cells through the second group of bit lines are sensed during a fourth develop time. At step 830, second data from the third plurality of memory cells through the third group of bit lines are sensed during a fifth develop time. In some examples, the fourth develop time is shorter than the second develop time and the fifth develop time is shorter than the third develop time. In some examples, a first difference between the second develop time and the first develop time, and a second difference between the third develop time and the second develop time, may be the same. In some examples, a third difference between the second develop time and the fourth develop time, and a fourth difference between the third develop time and the fifth develop time, may be the same. In some examples, the third difference and the fourth difference may be the same as the first develop time. In some examples, the fourth develop time may be equal to the first develop time. In some examples, the fifth develop time may be equal to the second develop time.

In some examples, a second discharge path associated with the second group of bit lines may be disabled after the fourth develop time; a third discharge path associated with the third group of bit lines may be disabled after the fifth develop time, to thereby perform the third read operation on the third plurality of memory cells.

In some examples, the second data may be latched corresponding to each of the third plurality of memory cells based on the third read operation to a logical value of one or zero.

In some examples, a first number of memory cells associated with the first group of bit lines corresponding to a logical value of one may be determined. A second number of memory cells associated with the second group of bit lines corresponding to a logical value of one may be determined. A third number of memory cells associated with the third group of bit lines corresponding to a logical value of one may be determined.

At step 812, a read develop time is determined based on the third read operation.

In some examples, the first number, the second number and the third number may be compared to obtain a minimum number of the first number, the second number and the third number. One of the first group of bit lines, the second group of bit lines, and the third group of bit lines corresponding to the minimum number of the first number, the second number and the third number may be determined. A develop time associated with the determined one of the first group of bit lines, the second group of bit lines, and the third group of bit lines may be determined as a read develop time. The first group of bit lines corresponding to the minimum number of the first number, the second number and the third number may be determined. A first develop time associated with the first group of bit lines may be determined as a read develop time. The read develop time may be an optimal develop time to determine one data state (e.g., P15) of a memory device, to minimize the impacts of threshold voltage (Vt) distribution shift using a pre-defined read level (e.g., $V_{R15}$) in FIG. 5.

In some examples, the first group of bit lines may include a first number of bit lines. In some examples, the second group of bit lines may include a second number of bit lines. In some examples, the third group of bit lines may include a third number of bit lines. In some examples, the first number, the second number, and the third number may be the same.

In some examples, the fourth develop time and the first develop time may be the same; and the fifth develop time and the second develop time may be the same.

Figure 8B:
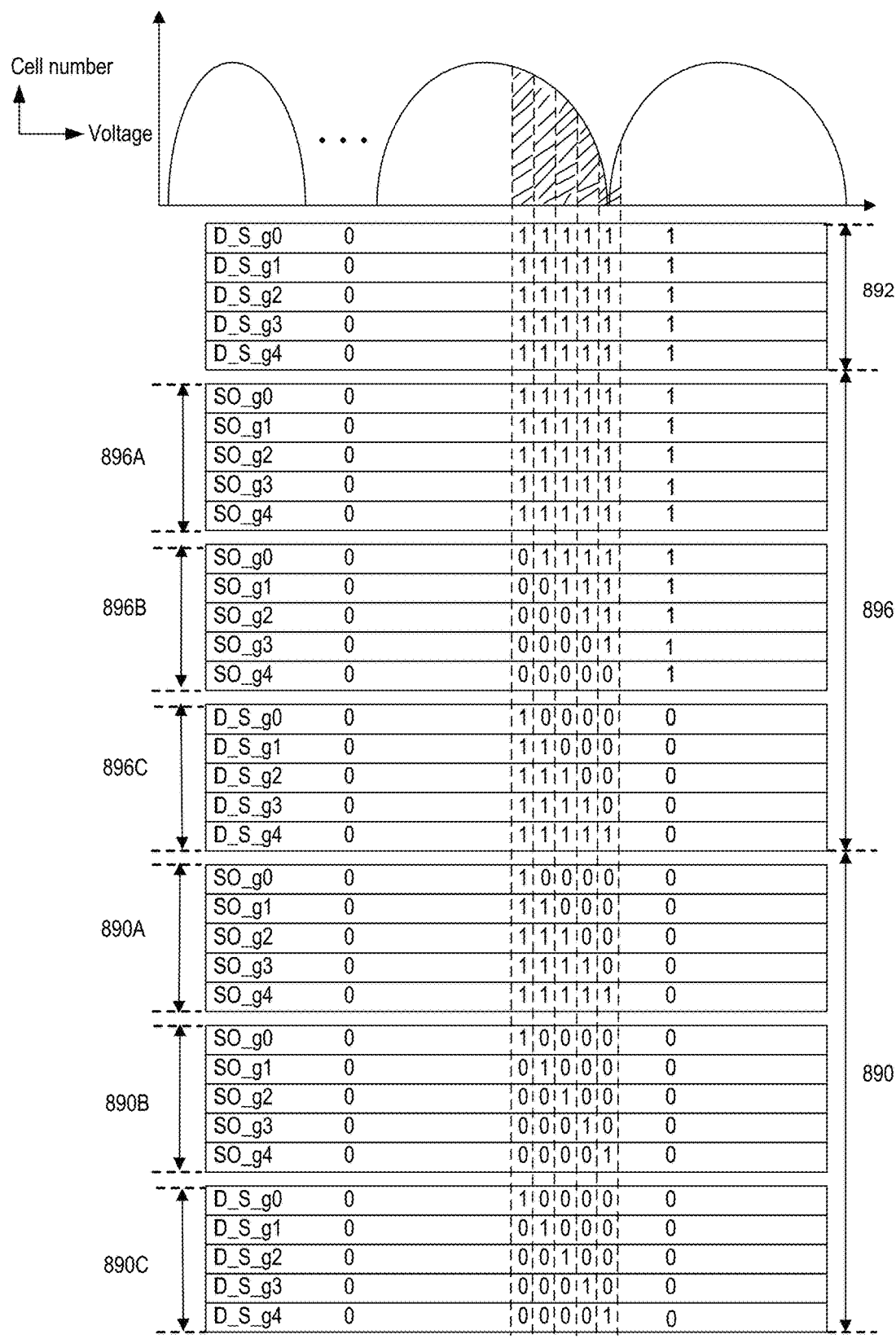
FIG. 8B illustrates an example threshold voltage distribution and data structures during the process flow of FIG. 8A, according to some embodiments.

FIG. 8B illustrates an example threshold voltage distribution and data structures during the process flow of FIG. 8A, according to some embodiments. FIG. 8B can be described with regard to FIG. 8A and FIGS. 1-7. Not all of the depicted components may be used, however, and one or more implementations may include additional components not shown in the figure. Variations in the arrangement and types of the components may be made without departing from the spirit or scope of the claims as set forth herein. Additional, different or fewer components may be provided.

FIG. 8B includes a first data structure 892, a second data structure 896 and a third data structure 890.

In some examples, first data structure 892 may include data associated with a latch (e.g., 680) in a page buffer (e.g., page buffer 52) associated with one or more memory cells, during the first read operation at step 802 in FIG. 8A. For example, first data structure 892 may be associated with page buffer 52 in FIG. 6B. First data structure 892 may include D_S_g0, D_S_g1, D_S_g2, D_S_g3, and D_S_g4, corresponding to a first bit line group g0, a second bit line group g1, a third bit line group g2, a fourth bit line group g3, and a fifth bit line group g4. Each of D_S_g0, D_S_g1, D_S_g2, D_S_g3, and D_S_g4 may include logical value of 1 or 0 to indicate a first state or a second state of the memory cells.

As described with reference to FIG. 6B, during a latch period, a state of SO 650 associated with the selected memory cell may be latched to sense latch 656 as a first state of the selected memory cell with a logical value of 1. Alternatively, a state of SO 650 associated with the selected memory cell may be latched to sense latch 656 as a second state of the selected memory cell with a logical value of 0. In some examples, a threshold voltage of the selected memory cell in the first state is larger than a read voltage in the read operation and a threshold voltage of the selected memory cell in the second state is smaller than a read voltage in the read operation. After the latch period, latch 680 may store the data associated with each of sense latch 656, sense latch 666, and sense latch 676, as data related to the bit lines, such as the first data structure 892.

In some examples, second data structure 896 may include data associated with one or more sense latches (e.g., sense latch 656, 666, and 676) and latch (e.g., 680) in a page buffer (e.g., page buffer 52) associated with one or more memory cells, during the second read operation at step 806. As described above, the second read operation is performed on the first plurality of memory cells including the steps 816, step 826 and step 836. Second data structure 896 may include data associated with five sense latches SO_g0, SO_g1, SO_g2, SO_g3, and SO_g4. Each of the SO_g0, SO_g1, SO_g2, SO g3, and SO_g4 may correspond to a sense latch associated with first bit line group g0, second bit line group g1, third bit line group g2, fourth bit line group g3, and fifth bit line group g4. The sense latch may be or include sense latch 656, 666 or 676.

In some examples, second data structure 896 includes second data structure 896A, 896B and 896C. Second data structure 896A may include data associated with one or more sense latches associated with the first plurality of memory cells. Second data structure 896A may include data associated with one or more sense latches associated with the first plurality of memory cells. Second data structure 896B may include data associated with one or more sense latches associated with the first plurality of memory cells, after the steps 816, step 826 and step 836 in step 806. Second data structure 896C may include modified data associated with latch (e.g., 680) in a page buffer (e.g., page buffer 52) associated with the first plurality of memory cells, after the steps 816, step 826 and step 836 in step 806. Latch in the page buffer may modify the data associated with the sense latches SO_g0, SO_g1, SO_g2, SO_g3, and SO_g4 to modify the logical value of 1 to the logical value of 0 or vice versa, as described with reference to FIG. 6B and FIG. 8A. Latch in the page buffer may provide the modified data in second data structure 896C.

In some examples, third data structure 890 may include data associated with one or more sense latches (e.g., sense latch 656, 666, and 676) and latch (e.g., 680) in a page buffer (e.g., page buffer 52) associated with one or more memory cells, during the third read operation at step 810. As described above, the third read operation is performed on the third plurality of memory cells including step 820, and step 830.

Third data structure 890 includes third data structure 890A, 890B and 890C. In some examples, third data structure 890A may include data associated with one or more sense latches associated with the third plurality of memory cells. In some examples, third data structure 890B may include data associated with one or more sense latches associated with the third plurality of memory cells, after step 820, and step 830 in step 810. In some examples, third data structure 890C may include data associated with latch (e.g., 680) in a page buffer (e.g., page buffer 52) associated with the third plurality of memory cells, after step 820, and step 830 in step 810.

In some examples, as described above with reference to step 812, a read develop time is determined based on the third data structure 890C.

In some examples, one or more cell numbers in a first state or a second state associated with first data structure 892, second data structure 896 and third data structure 890, may correspond to one or more regions in the exemplary threshold voltage distribution shown in FIG. 8B.

In the present disclosure, a read develop time is determined based on a third read operation, after a first read operation and a second read operation. The read develop time may be an optimal develop time to determine one data state (e.g., P15) of a memory device, to minimize the impacts of threshold voltage (Vt) distribution shift using a pre-defined read level (e.g., VR15) in FIG. 5.

Among others, two advantages with the present disclosure can include: (1) an improved read efficiency can be performed by obtaining the Vt distribution of multiple regions in the threshold voltage distribution at once, which saves not only the read sensing time but also the cell number counting time; (2) an improved system design can be performed by only one latch (e.g., latch 680) in the page buffer, thereby improving one or more circuit designs and performances.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A memory device, comprising:
    a memory array having memory cells;
    a page buffer coupled to the memory array through bit lines, wherein the page buffer comprises a latch; and
    a control logic coupled to the page buffer and configured to:
        perform a first read operation on the memory cells;
        perform a second read operation on the memory cells by dividing the memory cells into a plurality of groups of memory cells, and performing a second read operation on the plurality of groups of memory cells based on a first set of develop times, wherein each of the first set of develop times is different;
        perform a third read operation on the memory cells by performing a third read operation on the plurality of groups of memory cells based on a second set of develop times, wherein each of the second set of develop times is different; and
        determine a read develop time based on the third read operation.

2. The memory device of claim 1, wherein the control logic is further configured to:
    select, from the memory cells, a first plurality of memory cells in a first state and a second plurality of memory cells in a second state, based on the first read operation; and
    select, from the first plurality of memory cells, a third plurality of memory cells based on the second read operation.

3. The memory device of claim 2, wherein
to perform the second read operation on the memory cells, the control logic is further configured to:
    sense first data from the first plurality of memory cells through a first group of bit lines based on a first develop time;
    sense first data from the first plurality of memory cells through a second group of bit lines based on a second develop time; and
    sense first data from the first plurality of memory cells through a third group of bit lines based on a third develop time;
to perform the third read operation on the memory cells, the control logic is further configured to:
    sense second data from the third plurality of memory cells through a second group of bit lines during a fourth develop time; and
    sense second data from the third plurality of memory cells through a third group of bit lines during a fifth develop time, the fourth develop time being shorter than the second develop time, the fifth develop time being shorter than the third develop time; and
the first set of develop time comprises the first develop time, the second develop time, and the third develop time, and the second set of develop time comprises the fourth develop time and the fifth develop time.

4. The memory device of claim 1, wherein a number of the plurality of groups is 3 to 5.

5. The memory device of claim 2, wherein a threshold voltage of each of the first plurality of memory cells in the first state is larger than a read voltage in the first read operation, and a threshold voltage of each of a second plurality of memory cells in the second state is smaller than a read voltage in the first read operation.

6. The memory device of claim 3, wherein the control logic is further configured to:
    disable a first discharge path associated with the first group of bit lines after the first develop time;
    disable a second discharge path associated with the second group of bit lines after the second develop time; and
    disable a third discharge path associated with the third group of bit lines after the third develop time to thereby perform the second read operation on the first plurality of memory cells.

7. The memory device of claim 3, wherein the control logic is further configured to:
    latch the first data corresponding to each of the first plurality of memory cells based on the second read operation to a logical value of one or zero;
    modify the latched first data by obtaining a modified logical value corresponding to each of the first plurality of memory cells; and
    select the third plurality of memory cells from the first plurality of memory cells, wherein the modified logical value corresponding to each of the third plurality of memory cells is one.

8. The memory device of claim 3, wherein the control logic is further configured to:
    disable a second discharge path associated with the second group of bit lines after the fourth develop time; and
    disable a third discharge path associated with the third group of bit lines, after the fifth develop time, to thereby perform the third read operation on the third plurality of memory cells.

9. The memory device of claim 3, wherein the control logic is further configured to:
    latch the second data corresponding to each of the third plurality of memory cells based on the third read operation to a logical value of one or zero; and
    determine a first number of memory cells associated with the first group of bit lines corresponding to a logical value of one, a second number of memory cells associated with the second group of bit lines corresponding to a logical value of one, and a third number of memory cells associated with the third group of bit lines corresponding to a logical value of one.

10. The memory device of claim 9, wherein the control logic is further configured to:
    compare the first number, the second number, and the third number to obtain a minimum number of the first number, the second number, and the third number;
    determine one of the first group of bit lines, the second group of bit lines, and the third group of bit lines corresponding to the minimum number of the first number, the second number, and the third number; and determine a read develop time, the read develop time comprising a develop time applied on a group of bit lines corresponding to the minimum number during the second read operation or the third read operation.

11. The memory device of claim 3, wherein the first group of bit lines comprises a first number of bit lines;

the second group of bit lines comprises a second number of bit lines;

the third group of bit lines comprises a third number of bit lines; and the first number, the second number, and the third number are the same.

12. The memory device of claim 3, wherein a first difference between the second develop time and the first develop time and a second difference between the third develop time and the second develop time are the same.

13. The memory device of claim 3, wherein the fourth develop time and the first develop time are the same, and the fifth develop time and the second develop time are the same.

14. The memory device of claim 7, wherein to modify the latched first data, the control logic is further configured to modify the latched first data with the logical value of one to a logical value of zero, and modify the latched first data with the logical value of zero to a logical value of one.

15. A method for operating a memory device, comprising:

performing a first read operation on memory cells in the memory device;

performing a second read operation on the memory cells, comprising dividing the memory cells into a plurality of groups of memory cells, and performing a second read operation on the plurality of groups of memory cells based on a first set of develop times, wherein each of the first set of develop times is different;

performing a third read operation on the memory cells, comprising performing a third read operation on the plurality of groups of memory cells based on a second set of develop times, wherein each the second set of develop times is different; and determining a read develop time based on the third read operation.

16. The method of claim 15, further comprising:

selecting, from the memory cells, a first plurality of memory cells in a first state and a second plurality of memory cells in a second state, based on the first read operation; and selecting, from the first plurality of memory cells, a third plurality of memory cells based on the second read operation.

17. The method of claim 16, wherein performing a second read operation on the memory cells comprises:

sensing first data from the first plurality of memory cells through a first group of bit lines based on a first develop time;

sensing first data from the first plurality of memory cells through a second group of bit lines based on a second develop time; and sensing first data from the first plurality of memory cells through a third group of bit lines based on a third develop time;

performing a third read operation on the memory cells comprises:

sensing second data from the third plurality of memory cells through a second group of bit lines during a fourth develop time; and sensing second data from the third plurality of memory cells through a third group of bit lines during a fifth develop time, the fourth develop time being shorter than the second develop time, the fifth develop time being shorter than the third develop time; and the first set of develop time comprises the first develop time, the second develop time, and the third develop time, and the second set of develop time comprises the fourth develop time and the fifth develop time.

18. The method of claim 15, wherein a number of the plurality of groups is 3 to 5.

19. A memory system, comprising:

a memory device, comprising:

a memory array having memory cells;

a page buffer coupled to the memory array through bit lines, wherein the page buffer comprises a latch; and a control logic coupled to the page buffer and configured to:

perform a first read operation on the memory cells;

perform a second read operation on the memory cells by dividing the memory cells into a plurality of groups of memory cells, and performing a second read operation on the plurality of groups of memory cells based on a first set of develop times, wherein each of the first set of develop times is different;

perform a third read operation on the memory cells by performing a third read operation on the plurality of groups of memory cells based on a second set of develop times, wherein each of the second set of develop times is different; and determine a read develop time based on the third read operation; and a memory controller coupled to the memory device and configured to control the memory device.

20. The memory system of claim 19, wherein a number of the plurality of groups is 3 to 5.

* * * * *